United States Patent [19]

Lodahl

[11] Patent Number: 4,745,368
[45] Date of Patent: May 17, 1988

[54] SWITCHING AMPLIFIER

[75] Inventor: Manfred Lodahl, Berlin, Fed. Rep. of Germany

[73] Assignee: Licentia Patent-Verwaltungs-GmbH, Frankfurt am Main, Fed. Rep. of Germany

[21] Appl. No.: 911,918

[22] Filed: Sep. 26, 1986

[30] Foreign Application Priority Data

Sep. 28, 1985 [DE] Fed. Rep. of Germany ....... 3534679

[51] Int. Cl.$^4$ .............................................. H03F 3/38
[52] U.S. Cl. .................................. 330/10; 332/31 R; 455/108
[58] Field of Search ...................... 330/10, 202, 207 A, 330/251, 297; 332/31 R, 37 D, 41, 45, 59–62; 455/108, 109

[56] References Cited

FOREIGN PATENT DOCUMENTS 66904 12/1982 European Pat. Off. .
83727 7/1983 European Pat. Off. .
1816530 6/1970 Fed. Rep. of Germany .
3044956 9/1981 Fed. Rep. of Germany .
2064901 6/1981 United Kingdom .

OTHER PUBLICATIONS

Product Specification Page published by Datel, ©1983.

Primary Examiner—James B. Mullins
Attorney, Agent, or Firm—Spencer & Frank

[57] ABSTRACT

A digitally operating switching amplifier for direct and alternating voltage that is suitable as a modulation amplifier for radio transmitters with anode modulation. The power portion of the amplifier consists of cascade-connected, controllable, peak current-limited partial voltage sources that are connected via a low-pass filter to a load resistor, which is the high-frequency output stage in a radio transmitter. The control of peak current-limited partial voltage sources, some of which present differing voltage values, is effected in such a manner that a high degree of efficiency is attained and that distortions of the modulation signal are small.

21 Claims, 9 Drawing Sheets

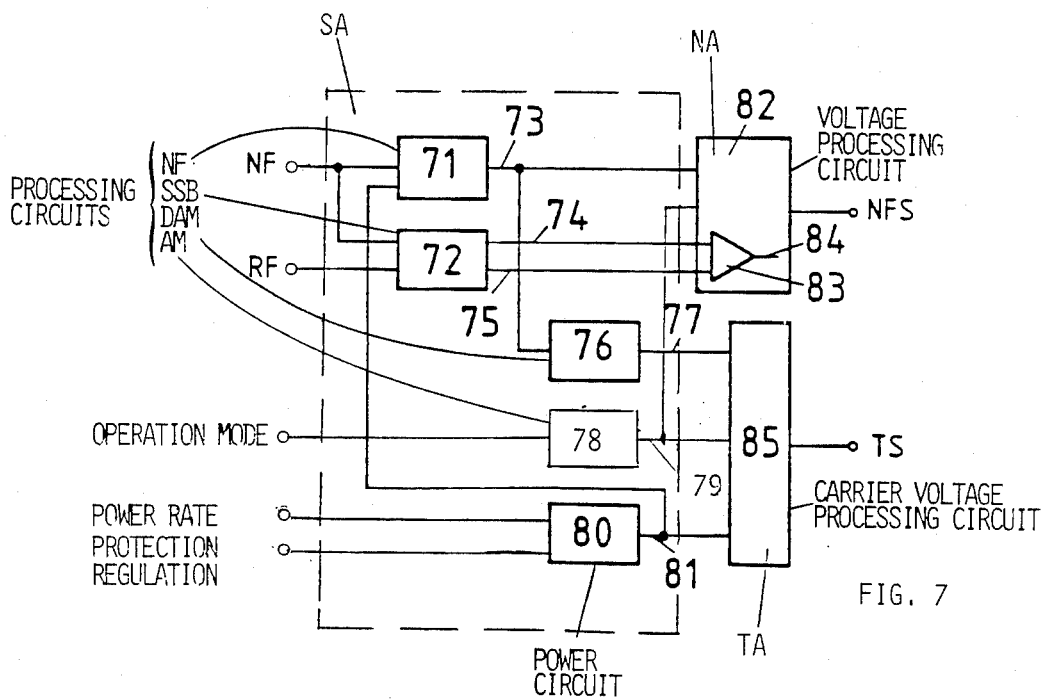

| NUMBER OF SAMPLES | | 0 | 1 | 2 | 3 | 4 |
|---|---|---|---|---|---|---|
| S1 | ON | X | X | | X | X |
| | OFF | | | X | | |
| S2 | ON | | X | X | X | |
| | OFF | X | | | | X |

FIG. 11

| NUMBER OF SAMPLES | | 0 | 1 | 2 | 3 | 4 | 5 | 6 | 7 | 8 |
|---|---|---|---|---|---|---|---|---|---|---|
| S1 | ON | X | X | | | | X | X | X | X |
| | OFF | | | X | X | X | | | | |
| S2 | ON | | X | X | X | X | X | | | |
| | OFF | X | | | | | | X | X | X |
| S3 | ON | X | X | X | X | | | | X | X |
| | OFF | | | | | X | X | X | | |
| S4 | ON | | | | | X | X | X | X | X |
| | OFF | X | X | X | | | | | | X |

FIG. 12

SWITCHING AMPLIFIER

BACKGROUND OF THE INVENTION

The present invention relates to a switching amplifier for a high voltage transmitter.

FRG Offenlegungsschrift [Laid-open Application] No. 1 816 530 describes a low frequency, high output power amplifier that is suitable for the modulation of the end stage of high frequency broadcasting transmitters. The amplifier consists of a plurality of controlled components acting together with a shared working resistor, preferably with uniform steps. Switching of the components from one state to another by modification of the control variable for the individual components is effected in time sequence in such a manner that the sum of the output variables is essentially an analog reproduction of the control variables. The controlled components are in series with the working resistor and are located at voltage sources with low internal resistance and rectifiers that allow passage of the effective current being inserted in the current paths from the terminals of the voltage sources to respective connection points between two of the controlled elements. The magnitude of the activating voltage is equal to that of the output voltage, whereby a linear relationship between the controllable voltage and the output voltage is to be achieved for the respective partial voltages. Such a design not only presents the disadvantage of very high control voltage but also makes enormously high demands on the limiting frequency of the components. Meeting such demands is barely possible when controlled semiconductors are used in this amplifier as modulation amplifiers for powerful radio transmitters (about 500 kW). Such a circuit also has the disadvantage that the voltage demanded by the rectifiers is very high.

It is considered more advantageous to arrange the partial voltage sources in the currently usual form of cascades of voltage sources in which the voltage demanded by the rectifiers serving as free-wheeling diodes is uniform. Such arrangements used as low frequency amplifiers is the basis of FRG Offenlegungsschrift DE-OS No. 30 44 956 A1 and European Patent Application No. 0 066 904 A1.

In an amplifier described in Offenlegungsschrift 30 44 956 A1, cascade-connected partial voltage sources are turned on or off by a clocked or non-clocked A/D converter that is controlled by an analog signal. To ensure that an output signal which is an analog to the input signal is generated, rather than a gradated signal with coarse gradations, an amplifier arrangement is connected in series to the partial voltage sources and is controlled by an error signal generated by the difference between the input signal and output signal of the cascade connection of partial voltage sources. The use of such a circuit as a low frequency amplifier for the high powers cited above presents great disadvantages since the level sensing of the A/D converter is affected by delays, and the turning on and off of the partial voltage sources is affected by switching time errors and by fluctuations in the voltage supply for the partial voltage sources that are still not taken into account, thus causing the signal correction amplifier circuit to be overloaded for the transmission of a low-distortion output signal as required for modulation of the high-frequency output stage of radio transmitters.

The last-cited Offenlegungsschrift also discloses an amplifier circuit with binary staggering of partial voltage sources. Because of the limited electrical strength of semiconductors, such an arrangement is suitable only for low-power amplifiers (below 10 kW), and in no case as a semiconductor modulation amplifier for high-power radio transmitters.

The switching amplifier disclosed in European Patent Application No. 0 066 904 A1 presents an arrangement of partial voltage sources similar to that of the last-cited Offenlegungsschrift. Here, too, a clocked A/D converter is used to control the partial voltage sources. The correction of the gradated, coarse-gradation output voltage signal is sought by obtaining fine gradation through division of an amplifier step into substeps whose output voltages are binarily weighted. It is further mentioned that it is further possible to correct the gradated, coarse - gradation output voltage signal with the aid of a delayed control signal.

In the switching amplifier described, nonlinear distortions may occur which, particularly at higher frequencies, are greater than permitted under international norms governing such quality requirements for radio transmitters. Because of the switching time error in semiconductor switches, improving gradation characteristics in the described manner is possible only for low frequencies. To permit improvement of the output voltage via a delayed control signal, the clock frequency for the A/D converter must not be too high. But this is in basic contradiction to the purpose of high frequency transmission. Because of the unavoidable switching errors in semiconductor switches, the output voltage in the case of semiconductor switches is affected by amplitude errors, particularly at high frequencies, these errors being, for system-related reasons, asymmetric to the zero voltage value of the analog alternating voltage. Asymmetry in the output signal results in a high distortion factor in the output signal.

SUMMARY OF THE INVENTION

It is therefore an object of the invention to provide a switching amplifier that can be used as a digitally operating modulation amplifier, particularly in radio transmitters with various modes of operation, in particular for amplitude modulation (AM) or dynamically controlled amplitude modulation (DAM) or single sideband operation (SSB), under partial or full power in these operating modes, and that has high efficiency in these modes of operation with the lowest possible output signal distortion.

The above and other objects are achieved, according to the invention, a switching amplifier for amplifying an input signal to produce a high voltage output signal to be fed to a high frequency output stage of a transmitter having a distortion level below a selected value, which amplifier includes:

a plurality of electronically switchable partial voltage sources each switchable between an on state for supplying an output voltage and an off state, the sources being connected together in series;

a plurality of rectifier diodes corresponding in number to the plurality of partial voltage sources and connected together in series aiding to form a series connection having output terminals for connection of a load;

means connecting each diode across a respective partial voltage source; and control means connected to receive the input signal and to switch the partial voltage sources between their on and off states as a function of the input signal, by the improvement wherein:

the connecting means comprise at least one peak current limiter connected in series between one said partial voltage source and one diode;

the number of partial voltage sources and the magnitude of the voltage produced by each partial voltage source are selected for maintaining the distortion level of the output signal below the selected value;

the control means comprise linearization means connected for compensating for non-linearities in the transmission characteristic of the amplifier; and the control means are operative for switching the partial voltage sources as a function of the polarity and amplitude of the input signal.

In the invention low output signal distortion levels are achieved by the fact that only partial voltage values are turned on or off as a function of the amplitude of the low frequency signal, as permissible in view of existing distortions. This drastically reduces the number of switching operations to prevent high power loss in the switching elements, without affecting the linearity of the output signal.

A further valuable characteristic of the invention is the conversion of the positive and negative portions of the low frequency voltage into distinct digital values. This feature prevents signal processing errors from causing asymmetric amplitude errors in the output signal which would result in a disruptively high distortion factor. Further this seperated signal processing leads to a simple way to alter the height of the partial voltage values in dependence of the input signal.

To further improve the linearity of the switching amplifier, linearization devices are provided for the carrier value as well as for the positive and negative low-frequency values.

A secure operation with high switching frequency and low losses in the semiconductor switches is achieved by the fact that an arrangement is provided for peak current limitation. This feature essentially limits the high peak current of the semiconductor switches caused by the commutation characteristics of the cascade-connected semiconductor diodes.

To keep the losses in the electronic switches low even at high switching frequency, there is provision, if needed, for two series-connected semiconductor switches or the parallel connection of any two series-connected semiconductor switches, combined with a suitable control algorithm.

From the point of view of circuit design, the creation of these system characteristics is achieved by the fact that the low-frequency voltage and the direct voltage value (carrier value) are processed separately by A/D converters. This allows detection of low-frequency signal amplitude and polarity regardless of the operating mode.

The above mentioned linearization devices are essentially composed of programmable logic modules that establish a linear relationship between the input signals and the output signals of the switching amplifier.

To ensure a high level of efficiency for the switching amplifier, the voltage jumps of the output signal are selected as large as possible, so that switching losses of the partial voltage sources will be as low as possible; on the other hand, however, the voltage jumps must be made small enough that the demands on the permissible distortions of the switching amplifier are satisfied. These requirements imply a control of the partial voltage sources that is a function of the low frequency amplitude.

Maximum voltage value is understood to be the one which, for a given circuit of partial voltage sources and of the components used therein, is the maximum voltage value of the partial voltage sources, a safety factor being taken into account. The partial voltage sources have differing voltages; they are correlated as to amplitude with the voltage to be amplified. The greater the voltage value to be amplified, the greater is the partial voltage assigned to this level. It is always the partial voltage source corresponding to the voltage value to be amplified that is turned on or off. The staggering of the partial voltages is selected so that a preset level of distortion is not exceeded. In the case of very low levels, the staggering of the partial voltages need only be so small that the admissible noise level is not exceeded by the distortion components. For technical reasons, it may be necessary to form groups of identical partial voltage sources although this increases the number of partial voltage sources. In such a voltage-controlled switching amplifier the number of times the individual partial voltage sources are turned on and off is minimal, which allows the frequency to be transmitted to be very high. In the process, switching losses are relatively small in comparison to output power.

The principle of such a voltage controlled digital amplifier is also applicable to binary staggering of partial voltages. This is achieved by the fact that a circuit logic prevents the low-order binary partial voltage sources from turning on and off and that, thus—as in the case of staggered partial voltage sources with direct signal voltage correlation—small changes will occur in the output voltage of the digital amplifier in the low signal voltage value range, while large changes will occur in the high range.

For a high power digital amplifier, it is appropriate to effect a combination of voltage-controlled partial voltage sources directly correlated with the signal voltage level and voltage-controlled binarily weighted partial voltage sources since the number of partial voltage sources is thereby kept small and it is possible, at the same time, to achieve high voltage output in the digital amplifier.

BRIEF DESCRIPTION OF THE DRAWING

FIGS. 2–8 are diagrams of practical examples of components of the embodiment of FIG. 1.

FIGS. 11 and 12 are tables illustrating switching patterns for the switch arrangements of FIGS. 5 and 6, respectively.

DESCRIPTION OF THE PREFERRED EMBODIMENT

Figure 1:
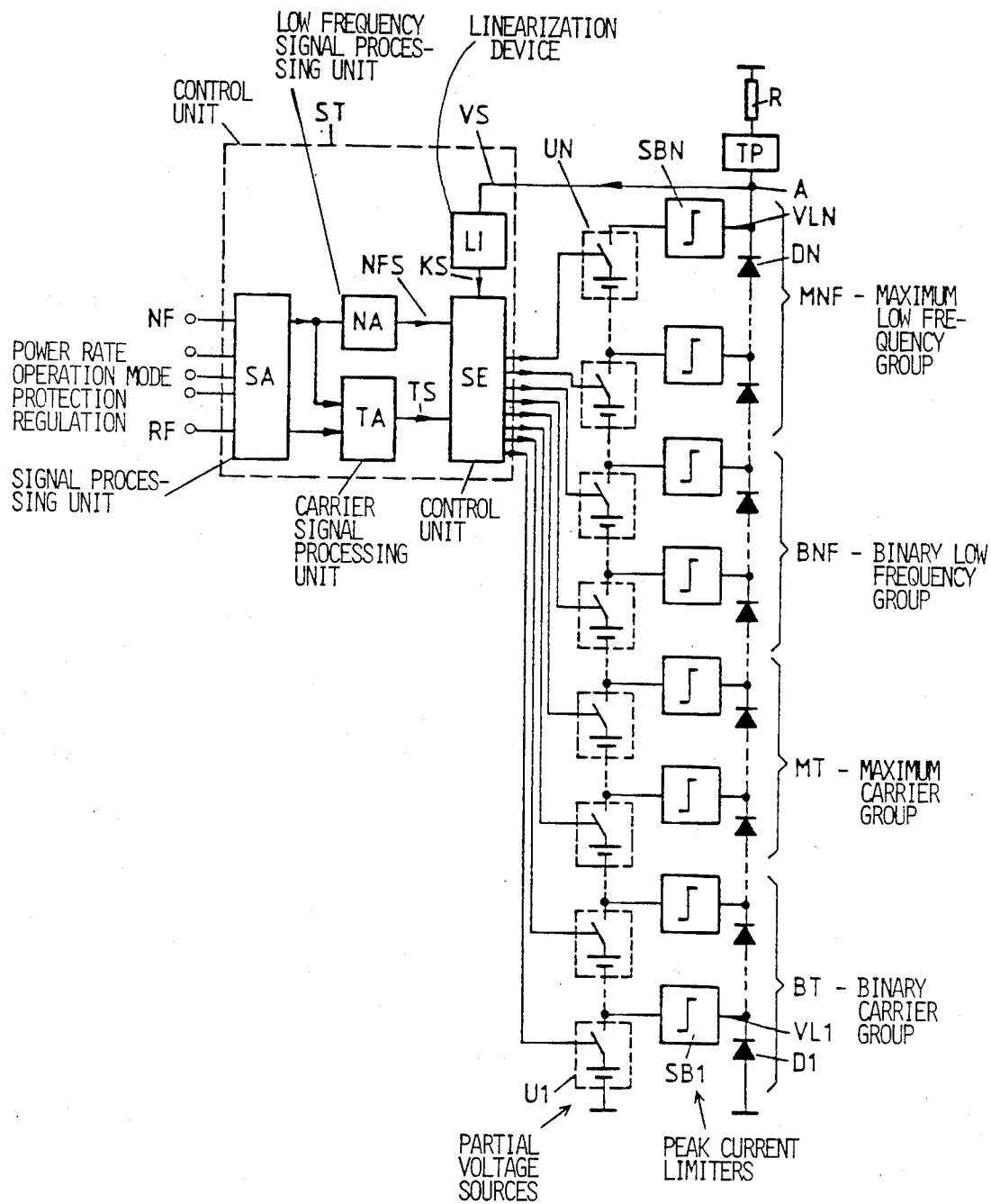
FIG. 1 is a schematic block diagram of a preferred embodiment of the invention.

FIG. 1 shows a diode cascade, consisting of a series connection of free wheeling diodes D1 to DN one end of which is grounded while the other end forms the output terminal A of the switching amplifier. Output terminal A is connected by low-pass filter TP to load R. Load R may be the amplitude modulated output stage electron tube of a high-frequency, high power transmitter with an output of 500 kW.

Figure 9:
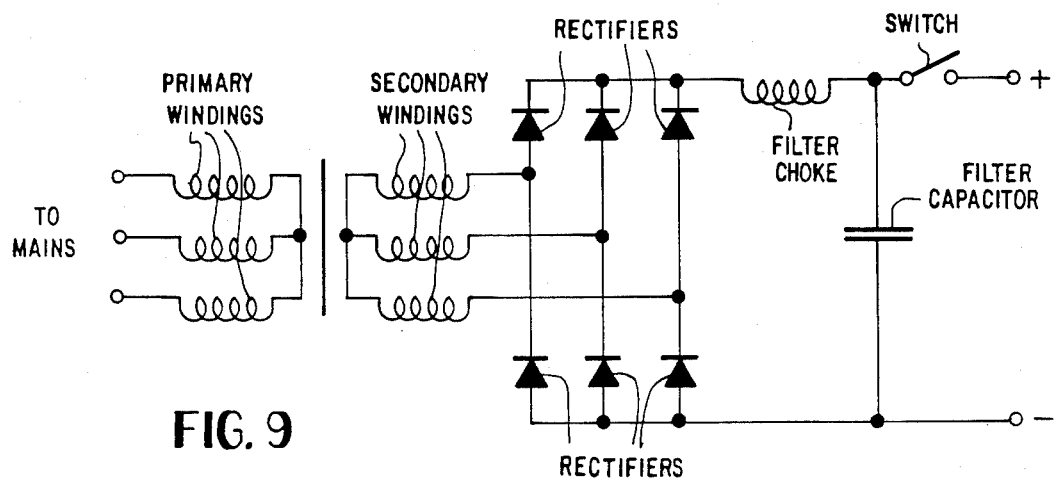
FIG. 9 is a circuit diagram of an embodiment of a partial voltage source of the apparatus of FIG. 1.

Connected in parallel with the diode series arrangement there is a series connection of switchable partial voltage sources U1 to UN. Each partial voltage source U is composed for example, of a semiconductor switch, such as a switching transistor and/or thyristor, connected in series with a voltage source. These may, for example, be assembled with the help of a 3-phase high voltage transformer for a 50 Hz network. An arrangement of such a transformer with its associated rectifier circuit and a connected switching device is shown in FIG. 9.

The partial voltage sources U1 to Un and the associated diodes D1 to DN are connected, as shown, by respective linking connections VL1 to VLN, each of which includes a respective peak current limiter SB1 to SBN. The partial voltage sources U1 to UN are divided into two groups, a low frequency signal group BNF, MNF and a carrier signal group BT, MT. Each of these two groups is composed of a group of maximum voltage sources that are designated maximum carrier group MT and maximum low-frequency group MNF, and a group of binarily weighted voltage sources that are designated binary carrier group BT and binary low-frequency group BNF.

The cumulative voltage of each of the binarily weighted voltage source arrangements BT or BNF is identical to the voltage of each of the associated maximum voltage sources MT or MNF, reduced by the smallest binary voltage value. The binary voltage sources BT, BNF are supplied with power, for example, by an intermediate transformer (not shown) whose secondary presents as many windings or winding arrangements as there are low-frequency or carrier groups, and whose primary is connected to one of the secondary windings of the above-cited high voltage transformer.

Each of carrier groups BT, MT furnishs an output voltage of the switching amplifier that is preferably one half the maximum output voltage of the amplifier. When all low-frequency and carrier maximum voltage groups MNF, MT are turned on, the maximum output voltage of the amplifier has been reached. The partial voltage sources U1 to UN are turned on and off via control unit ST which processes the control voltages for the partial voltage sources to whose low-frequency input terminal NF the low-frequency signal to be amplified is fed with a bandwidth, for example, of 5 kHz, and to whose high-frequency input terminal RF a high-frequency carrier signal is fed with a frequency, for example, of 10 MHz. The commands for turning on and off the low-frequency groups BNF, MNF are derived from the positive portions of the low-frequency voltage applied to terminal NF. In the practical example of a modulation amplifier for radio transmitters, this involves a voltage that corresponds to the positive portions of the low-frequency alternating voltage.

In the case of double sideband operation (DSB), this voltage corresponds to the positive portions of the modulation voltage, and in the case of single sideband operation (SSB), to the portion of the SSB envelope curve signal that is greater than the envelope curve voltage value assigned to the carrier value.

The commands for turning on and off the carrier group BT, MT are derived both from a carrier voltage applied to terminal RF and from the negative portions of the low-frequency voltage applied to terminal NF. The NF voltage and the RF carrier voltage are obtained in a circuit for the voltage processing of control unit ST, which is fed the NF signal and the RF carrier signal and which takes into account the various operating modes of a radio transmitter. These operating modes are amplitude modulation (AM) and dynamically controlled amplitude modulation (DAM), in the case of double sideband operation (DSB), as well as single sideband operation (SSB). In either operating mode, the transmitter may operate under partial or full load.

In this arrangement, low-pass filter TP located at output terminal A of the diode cascade serves mainly to limit the output signal bandwidth. Since, owing to the voltage controlled digital signal amplification, the output voltage is a very good approximation of the original signal, filtering can be kept advantageously small. This permits customary inverse envelope curve feedback, even up to high signal frequencies, thereby considerably reducing the distortion factor.

When the switching amplifier operates the voltage sources have floating potentials against ground (earth), depending on the control voltages of the switching amplifier. This floating potential occurs an the secondary windings of the transformer too. Depending on the position of the voltage sources in the circuitry, there are different voltages between the secondary windings and the primary winding and/or a screen winding. These voltages can reach a value which is comparable to the peak output voltage of the switching amplifier. The switching amplifier can be provided with separate transformers, one for each voltage source or, more economically, with one transformer having one primary winding and separated secondary windings, one for each voltage source.

Figure 10:
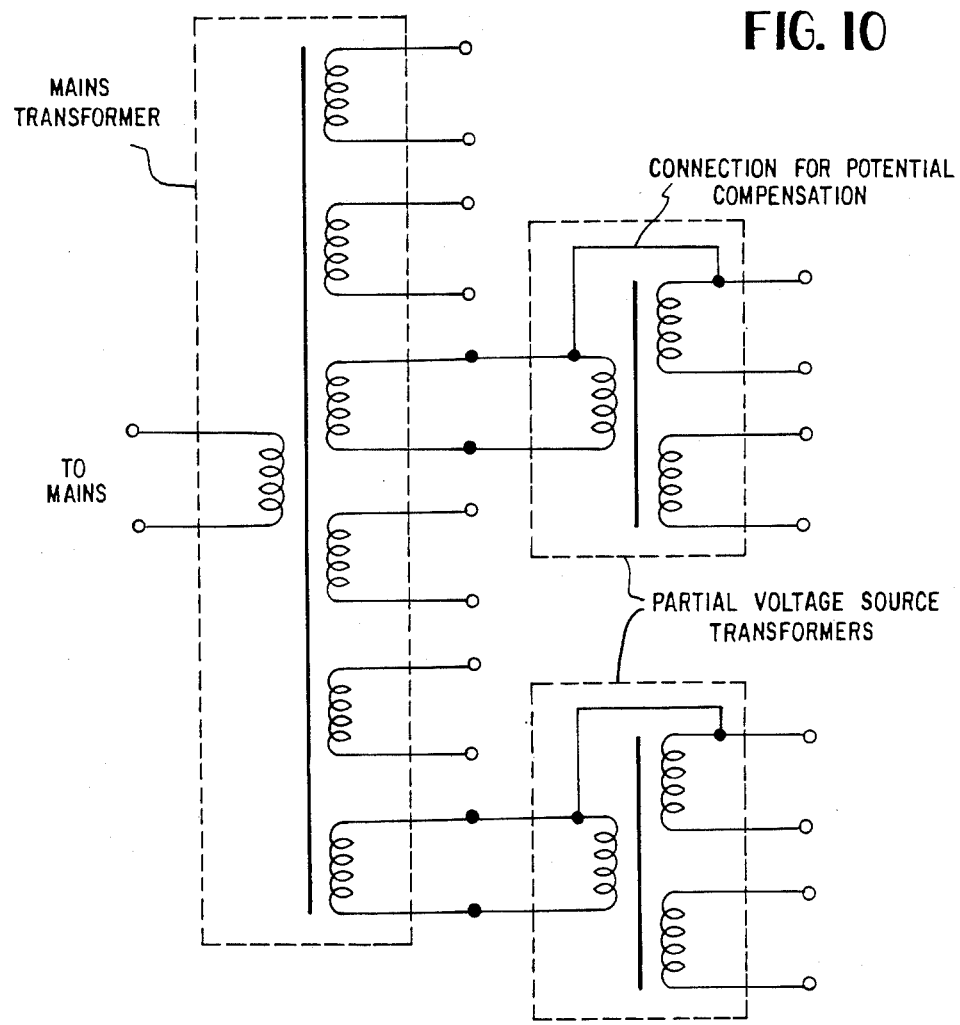
FIG. 10 is a circuit diagram of an embodiment of a power supply for the partial voltage sources of FIG. 1.

In the case of a high voltage mains, e.g. 4 kV, 50 Hz, which is preferrable for high power transmitters, e.g. 500 kW, the transformer preferrably consists of an arrangement of one primary winding and separated secondary windings. Thereby each maximum voltage source and each group of binarily weighted partial voltage sources has its own secondary winding. The different partial voltage sources of one group are connected to the secondary windings of the transformer with the help of an additional 3-phase transformer which has one primary winding and a number of secondary windings, depending on the number of voltage sources in a group and the corresponding voltages. Such an arrangement is shown in FIG. 10 for a 1-phase mains to simplify the figure. In these partial voltage source transformers is a connection for potential compensation. This connection is between one of the secondary windings and the primary winding. This connection prevents these transformer from getting a high voltage between the primary winding and the secondary windings and further from high voltages between the corresponding windings of the mains transformer with its adjacent secondary windings.

In case of a low voltage mains, e.g. 380 V, a preferrable arrangement consists of a transformer with one primary winding and secondary windings which belong to the maximum voltage sources. Whereas each group of binarily weighted partial voltage sources has its own transformer which is fed directly from the mains.

FIG. 2 shows a sample set-up for one of the partial voltage sources, U1 to UN, which includes, as the switch, a controllable semiconductor switch. Suitable semiconductors may, for example, be power transistors, field-effect transistors, thyristors and/or GTOs. The partial voltage source U1 selected by way of example has an associated diode 11 through which current will flow whenever the semiconductor switch is closed. When all partial voltage sources U1 to UN are turned off, there is no flow of current. Source U1 further includes a voltage source NG1 which is preferably a 3-phase rectifier.

Peak current limiters SB1 to SBN of FIG. 1 limit the current peak caused essentially by the commutation current of the associated diode when the switch is turned on, thereby enabling considerably higher operating currents for the partial voltage sources U1 to UN. Such an arrangement is particularly advantageous for partial voltage sources that use a field-effect transistor as switch. In FIG. 2, peak current limiter SB1 consists in the simplest version of an ohmic resistor. Another practical example of a peak current limiter is a parallel connection of a resistor and an inductor, as shown in FIG. 3. Alternatively, in one or both of the branches of the parallel connection of FIG. 3, a diode may additionally be provided in series connection with the resistor and/or inductor, as shown in FIGS. 4A AND 4B.

The current limiter SB1 is located between the output terminal of the switch and the output terminal of the associated diode D1. In this advantageous arrangement, loading of the overall circuit by the peak current limiters results only in the partial voltage source that is just turning on or off.

FIGS. 5 & 6 show practical examples of a switch. In the simplest version, this involves a semiconductor switch connected in series to the associated rectifier NG1. By means of the series connection of two semiconductor switches, as shown in FIG. 5, and a suitable control algorithm, the switching losses of the switching arrangement can be distributed in optimum fashion between the two semiconductor switches.

A parallel connection of two pairs of series connected semiconductors as shown in FIG. 6, combined with a suitable control algorithm, can raise not only the switching power of the switch arrangement but also switching frequency for the purpose of improving the linearity of the switching amplifier. In such a case, the control can prevent the particularly critical occurrence of reactivation immediately following turn-off. FIGS. 11 and 12 show switching patterns (control algrithms) for operating the switch arrangements shown in in FIGS. 5 and 6 respectively. The switches are denoted S1 to S4.

For the transmission of control signals from control unit ST to the semiconductor switches of the partial voltage sources, which are at high voltage potential, light wave conductors (LWL) with conventional light transmission and light reception transducers are suitable, for example.

FIG. 7 is a block circuit diagram providing a more detailed representation of the portion of FIG. 1 which includes signal processing SA, low-frequency signal processing NA and carrier signal processing TA. In these blocks, a new NF control signal NFS and a new carrier control signal TS are derived from the incoming signals NF and RF to be amplified. These control signals are fed to control unit SE (FIG. 1). In accordance with FIG. 7, the NF signal to be amplified reaches NF processing circuit 71 as well as SSB processing circuit 72 which, in addition, is supplied with the RF signal.

The NF processing circuit 71 is composed of circuit devices that are customary in radio transmitters for such purpose, such as band limiters, level adjusters and limiters and generates an NF output signal 73. In SSB processing circuit 72, the SSB signal is derived from the incoming RF and NF voltages, an SSB envelope curve signal 74 being derived from the SSB signal. In addition, SSB processing circuit 72 furnishes an SSB carrier value signal 75 that is specifically voltage-correlated with the SSB envelope curve signal 74.

In a DAM signal processing 76, a DAM signal 77 is derived from NF output signal 73. Further, circuit devices are provided in AM processing circuit 78 for the purpose of obtaining a highly stable AM signal 79. In power circuit 80, devices are provided to obtain a power signal 81 for operation of the radio transmitter at various carrier power levels. Signal 81 is supplied to NF processing circuit 71 and a carrier voltage processing circuit 85.

In an NF voltage processing circuit 82, a comparator 83 generates an NF SSB voltage 84 —derived from SSB envelope curve signal 74 and SSB carrier value signal 75 —which essentially corresponds to the envelope curve signal. In this voltage 84, in contrast to SSB envelope curve signal 74, only those level values of the envelope curve signal that are greater than the SSB carrier value signal have positive polarity, while those that are smaller than the SSB carrier value signal have negative polarity. SSB carrier value signal 75 is a level value derived from the SSB carrier value. In NF voltage processing circuit 82, NF control signal NFS is derived from the NF signal when under DSB operation, and from the NF SSB voltage 84 when under SSB operation.

Carrier voltage processing circuit 85 furnishes a carrier control signal TS that takes into account the different operating modes of a radio transmitter, such as AM, DAM, SSB, nominal and partial power operation.

Figure 8:
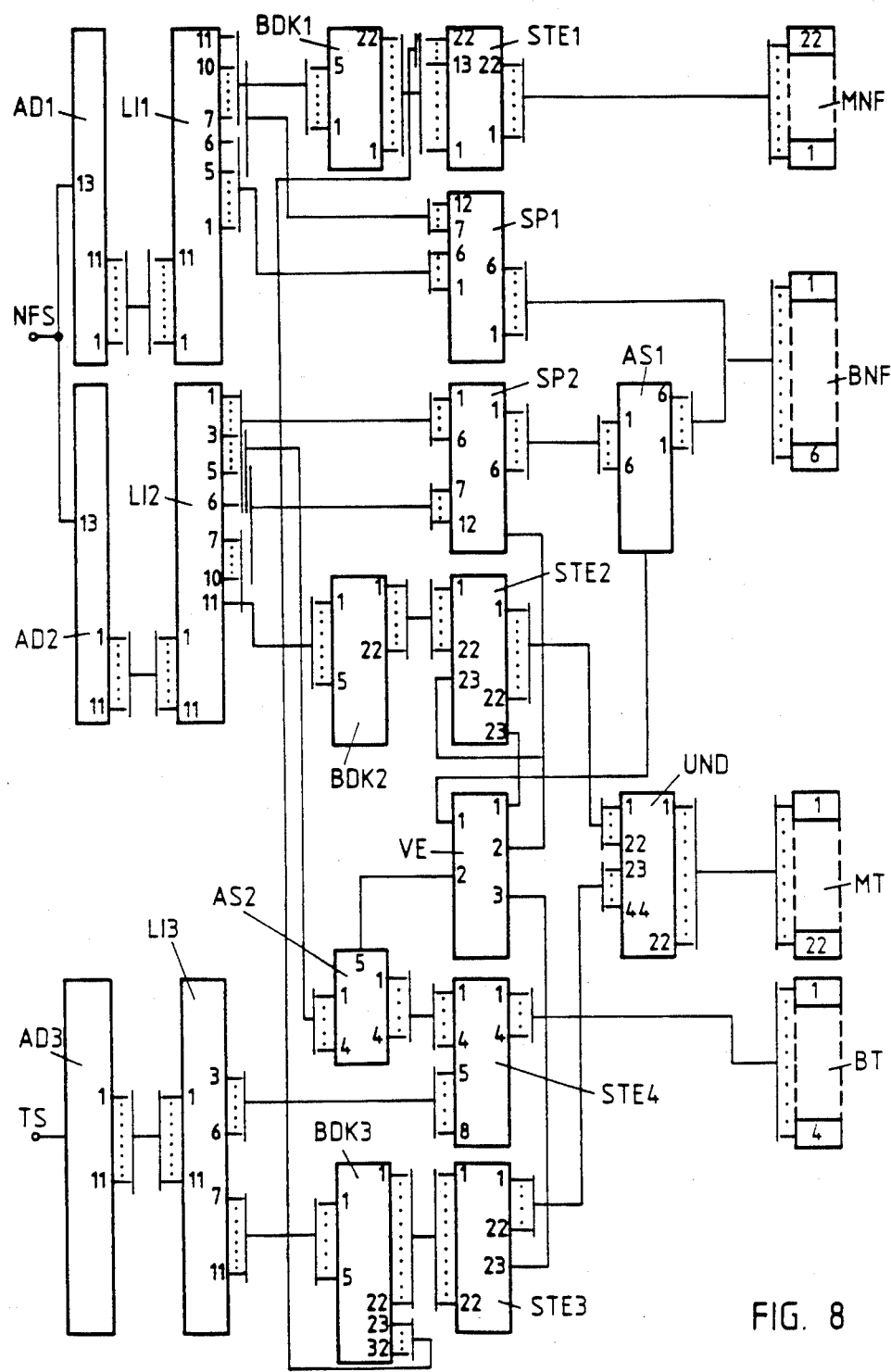

FIG. 8 is a more detailed block diagram of control unit SE and of linearization device LI from FIG. 1. Linearization device LI is shown in the "operation" mode, so that the connection line of FIG. 1 for reference signal VS is not shown in FIG. 8. Reference signal VS is needed merely for the "programming" mode of the linearization device. The mode of operation of the linearization device is explained below in greater detail.

In FIG. 8, all partial voltage sources U1 to UN are activated by NF control signal NFS and carrier control signal TS, N=54 having been selected for this example. Binary carrier group BT contains, for example, the four partial voltage sources U1 to U4 which generate the binarily weighted direct voltages 40 V, 80 V, 160 V and 320 V, respectively. Maximum carrier group MT contains, for example, the 22 partial voltage sources U5 to U26, each of these maximum carrier voltage sources generating a direct voltage of 640 V. Maximum low-frequency group MNF contains, for example, 22 partial voltage sources, such as U27 to U48, each generating a direct voltage of 640 V. Binary low-frequency group BNF contains 6 partial voltage sources, such as U49 to U54, which generate the binarily weighted direct voltages 10 V, 20 V, 40 V, 80 V, 160 V and 320 V, respectively.

The operating mode of control unit SE is such that, when a carrier control signal TS is on line, binary carrier voltage sources BT and carrier maximum voltage sources MT are turned on as a function of the magnitude of the carrier control signal TS. When additional NF control signal NFS is present, appropriate carrier partial voltage sources BT, MT are turned off for negative voltage values of signal NFS, depending on their respective levels. This results in a lowering of the output voltage in relation to the level associated solely with the carrier value. In the event of positive voltage values of control signal NFS, selected NF partial voltage sources BNF, MNF are turned on in addition to the number of turned-on carrier partial voltage sources BT, MT determined by the carrier control signal TS. This results in a raising of the output voltage in relation to that associated with the carrier value.

NF control signal NFS is fed to two A/D converters, AD1 and AD2. Converter AD1 converts the positive values and converter AD2 converts the negative values of NF control signal NFS into digital values. A third A/D converter, AD3, is fed carrier control signal TS and converts that control signal into digital values. Each of these A/D converters may have, for example, a capacity of 11 bits. Alternatively, the two A/D converters AD1 and AD2 for the NF control signal may be replaced by a single A/D converter equipped with a sign (polarity) bit. In the interest of a clear understanding of the circuit configuration shown in FIG. 8, however, further description of the operating mode of the control circuit will assume the existence of three A/D converters.

If the smallest binary partial voltage is Umin and the number of binary low-frequency partial voltages is n, the cumulative voltage of the n binary partial voltage sources is $(2^n-1)$Umin. Consequently, the maximum voltage source must have the voltage UMax=$2^n \cdot$ Umin. The maximum output voltage $U_{VMax}$ at the output terminal A of the switching amplifier will be reached when all maximum voltage sources MT, MNF are turned on.

If l is the number of carrier maximum voltage sources MT and k that of NF maximum voltage sources MNF, the maximum output voltage of the switching amplifier is $$U_{VMax}=(l+k)\cdot 2^n\cdot U_{min}.$$

In the exemplary circuit of FIG. 8, n=6 and l=k=22 were selected. This gives $$U_{VMax}=2816\cdot U_{min}.$$

Figure 13:
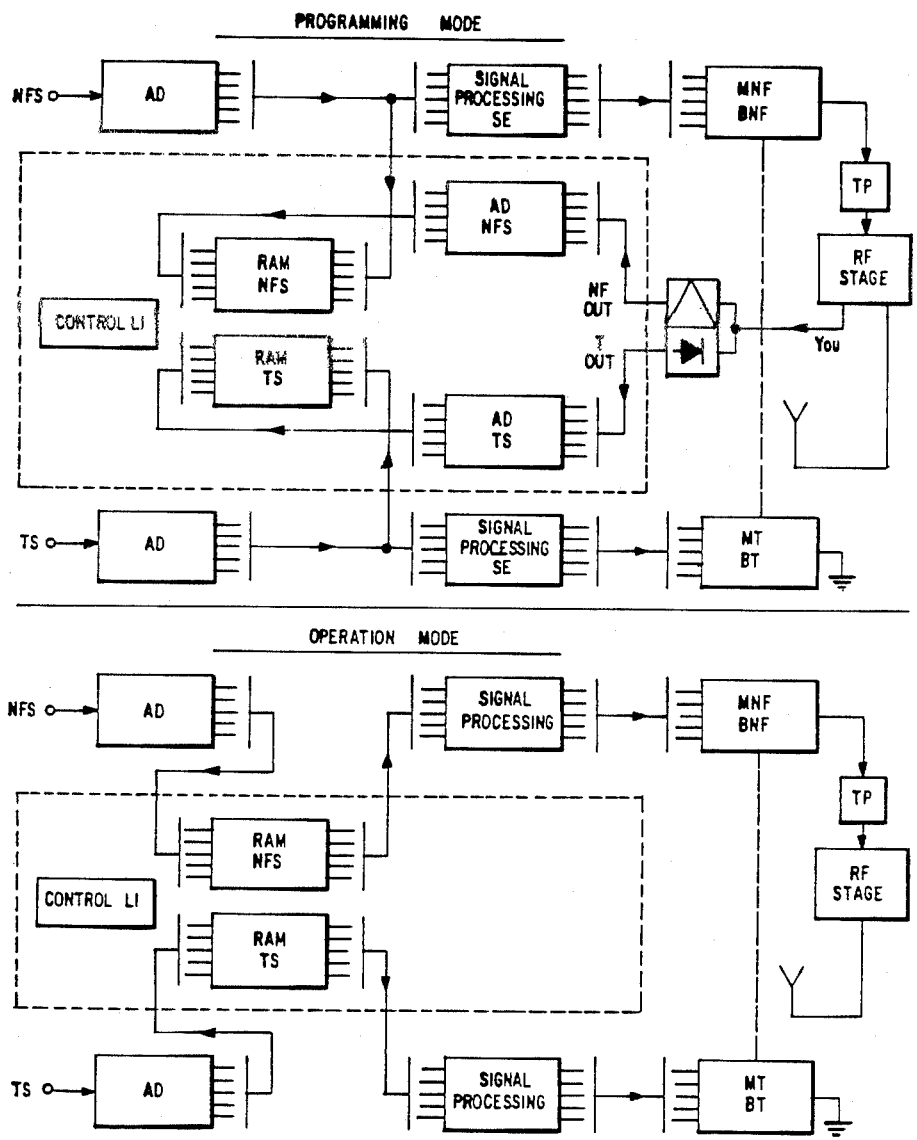
FIG. 13 is a block diagram of a programmable logic for the control unit of FIG. 8.

To each of the three A/D converters AD1, AD2, AD3 is connected, in series, a respective one of the linearization devices LI1, LI2, LI3 by means of which a linear relationship is established between the carrier and NF signals and the output voltage of the switching amplifier. In the simplest version, the linearization devices are, for example, a fixed programmed logic, i.e., a programmable read only memory (PROM), whose addresses are digitalized input values of the NF control signal NFS and the carrier control signal TS, respectively, and whose stored contents give the digital control voltage values for the partial voltage sources. According to FIG. 13 in an expanded version, a programmable logic may be provided in which a control logic executes so-called routines, as needed, and thus updates the memory content of the programmable logic. In the programming routine (upper part in FIG. 13), the output voltage out of the transmitter is determined by a specific ratio between carrier and NF voltage by means of one or more additional A/D converters (AD, NFS/AD, TS) and this value is indicated as address of the programmable logic (RAM NFS, RAM TS). The stored values of these addresses are the control voltage values digitalized by the corresponding A/D converter of the control circuit. Upon completion of the input routine, the stored values comprise the level values required for the linearization. Referring to the lower part of FIG. 13 in the operating mode, the addresses of the programmable logic are called up by the output values of the A/D converters and the memory contents of this logic are transmitted to the voltage raters and converters (signal processing) of the switching unit. In this manner, the transmission characteristics of the overall switching amplifier are taken into account and corrected.

To output terminals Bit 1 to Bit 6 of linearization devices LI1, LI2 shown for the NF control signal, are connected voltage raters SP1, SP2, and to corresponding outputs of linearization device LI3 for the carrier voltage (in the example: Bit 3 to Bit 6), is connected a control element STE4 for the binary partial voltage sources. Output terminals Bit 7 to Bit 11 of each of the linearization devices LI1, LI2, LI3 are linked to the input terminals of a respective one of binary/decimal converters BDK1, BDK2, BDK3. In addition, outputs Bit 6 to Bit 11 of linearization devices LI1, LI2 for the NF control signal provide data for evaluation of the digital voltage values of Bit 1 to Bit 6.

To the output terminals of voltage raters SP1, SP2 are connected the control lines of binary partial voltage sources BNF, a first activation circuit AS1 being connected in series between voltage rater SP2 and sources BNF. In a simple circuit version, voltage evaluation is effected so that HIGH potential at Bit 6 output terminal and the highorder bits evaluate the digital value of Bit 1 output so that continuous LOW potential or continuous HIGH potential at the corresponding output terminal 1 of the voltage rater causes continuous turning off of the low-order binary partial voltage sources (partial voltage source 1); that HIGH potential at Bit 7 output terminal and high-order bits evaluate the digital values of Bit 1 and Bit 2 output; that continuous LOW potential or continuous HIGH potential at the corresponding output terminals 1 and 2 of the voltage rater effect continuous turning off or continuous turning on of binary partial voltage sources 1 and 2; and that HIGH potential at Bit 11 evaluates the digital value of bits 1, 2, 3, 4, 5, 6, in such a manner that continuous LOW potential or continuous HIGH potential at the corresponding output terminals 1, 2, 3, 4, 5, 6, of the voltage rater causes continuous turning off or continuous turning on of all binary partial voltage sources.

Binary/decimal converters BDK1, BDK2 connected to output terminals Bit 7 to Bit 11 of linearization devices LI1, LI2 convert the digital value of these outputs into a decimal number, of which only numbers 1 to 22 are evaluated in this example.

In converter BDK3 for the carrier value, all 32 output terminals are wired. Thus, in contrast to other operating modes, it is possible, when the assignment of control powers to the partial voltage sources is changed under SSB operating mode with envelope curve control, to make the carrier value larger than the half of the maximum output voltage of the switching amplifier.

Since the NF control signals are smaller under SSB operation with envelope curve control than under DSB operation, the 10 high-order NF maximum voltage sources MNF are used for the 10 additional carrier maximum voltage sources.

The output terminals of converters BDK1, BDK2, BDK3 are connected to control elements STE1, STE2, STE3 whose output terminals are connected to the control lines of maximum voltage sources MNF, MT, this connection being, in the case of control element STE1, directly, and in the case of control elements STE3 and STE2, via a logic AND-AND connection UND.

Control element STE1 evaluates the level data of series-connected BDK1 and turns on the required number of NF maximum voltage sources in accordance with the level value of the positive NF control signal. Under SSB operation, additional evaluation of converter BDK3 is also effected.

In control element STE2 level data about series-connected converter BDK2 and level information about voltage rater SP2 are taken into account, which consists in the fact that a HIGH potential is always transmitted to control element STE2 when a HIGH potential is present at at least one of output terminals Bit 1 to Bit 6 of linearization device LI2. Thus, in the event of output voltage values that are smaller than the carrier value and are generated by calling on binary NF voltage sources, the voltage value of the carrier maximum voltage sources only is always smaller than would correspond to the level value provided from the negative NF voltage and the desired voltage value is achieved by the addition of binary NF voltage sources. So that the output voltage that is negative in relation to the carrier value will be symmetrical to the positive output voltage, voltage rater SP2 sees to it that the greater the negative amplitude of the NF control signal, corresponding to the level evaluation scheme, the fewer the binary NF partial voltage sources that are turned off until, finally, at the limit when the negative NF control signal is large, all binary NF partial voltage sources are continuously turned off. In this condition, the total of the binary NF partial voltage sources represents, in replacement, a maximum voltage source which is turned off altogether for the largest value of the NF control signal to be processed and also remains turned off in the event of overload.

Binary carrier voltage sources BT serve for precise carrier value adjustment and, under DAM operation, see to it that the out of band radiation of the radio transmitter, caused by the modulation process, do not exceed an admissible limit. The output level under DAM operation is thus formed with the help of two binary partial voltage arrangements, i.e., the binary carrier voltages and binary NF voltages.

The carrier value, including the one under DAM operation, ranges between such high voltage values that it is sufficient to limit the binary rating of the carrier voltage to 4 bits. The binary carrier voltage sources are turned off one after another by the negative NF control after all carrier maximum voltage sources have been turned off.

Control of binary carrier voltage sources BT is effected by control element STE4 to whose input terminals are connected four output terminals of linearization device LI2 (Bit 3 to Bit 6) and four output terminals of linearization device LI3 for the carrier (Bit 3 to Bit 6). These eight connections are the address lines of the memory of STE4. In the memory there is assigned to each address the level value resulting from the difference between the carrier value of Bit 3 to Bit 6 and the NF negative value of Bit 3 to Bit 6.

Level comparison between voltage rater SP2 and control element STE2, on the one hand, and control element STE3 for the carrier, on the other hand, in a comparator VE, determines when the last carrier maximum voltage source is turned off by the NF control signal, so as then to connect the address lines carrying the NF negative value through to the memory of STE4 via the activation circuit AS2, whereby the turning off of the binary voltage source so is initiated. At the same time, the comparator VE prevents the turning on of the binary NF voltage sources via the activation circuit AS1.

Figure 14:
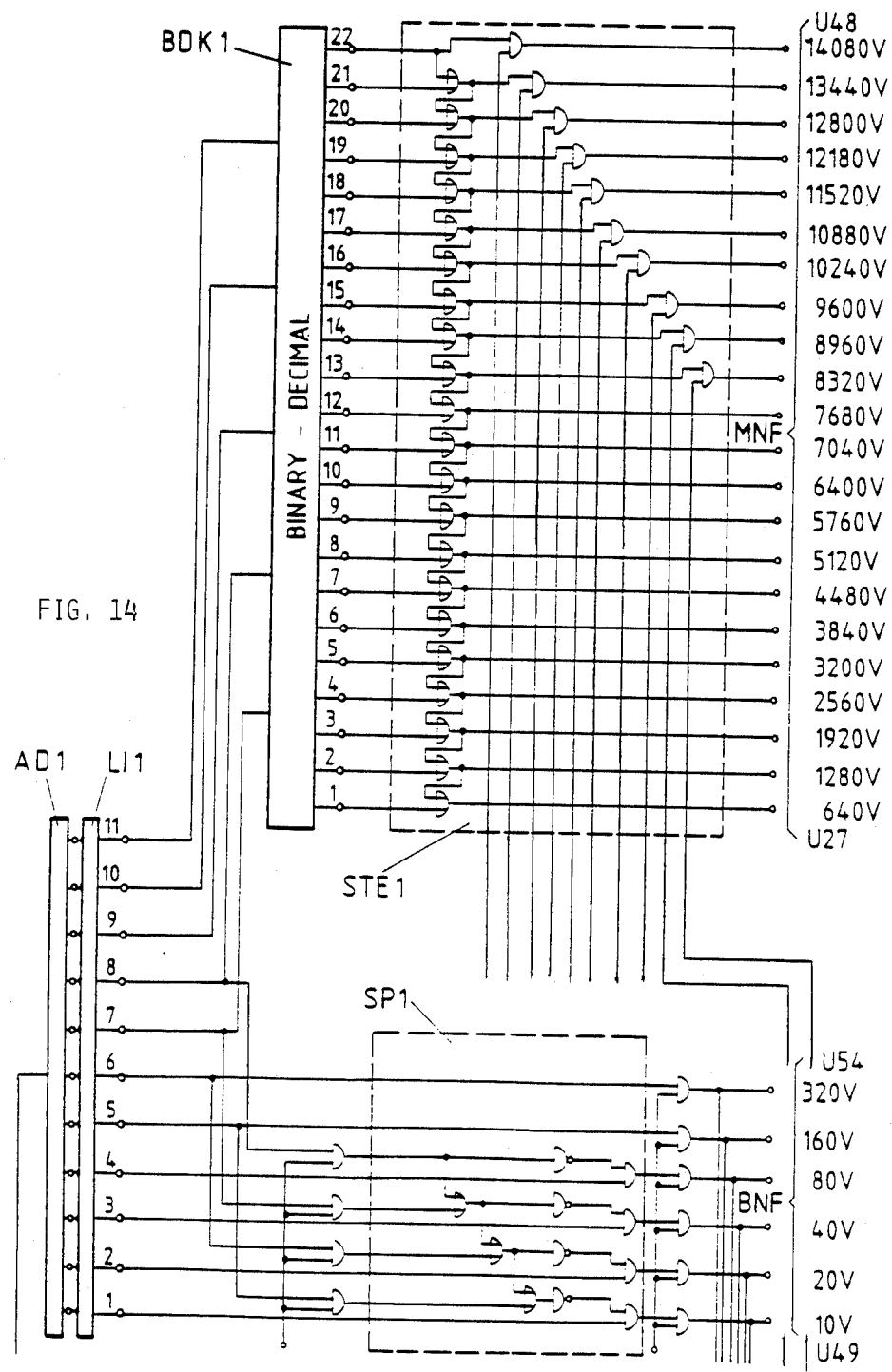
FIGS. 14, 15 and 16 are detailed block diagrams of respective portions of an embodiment of the control unit of FIG. 8.
Figure 15:
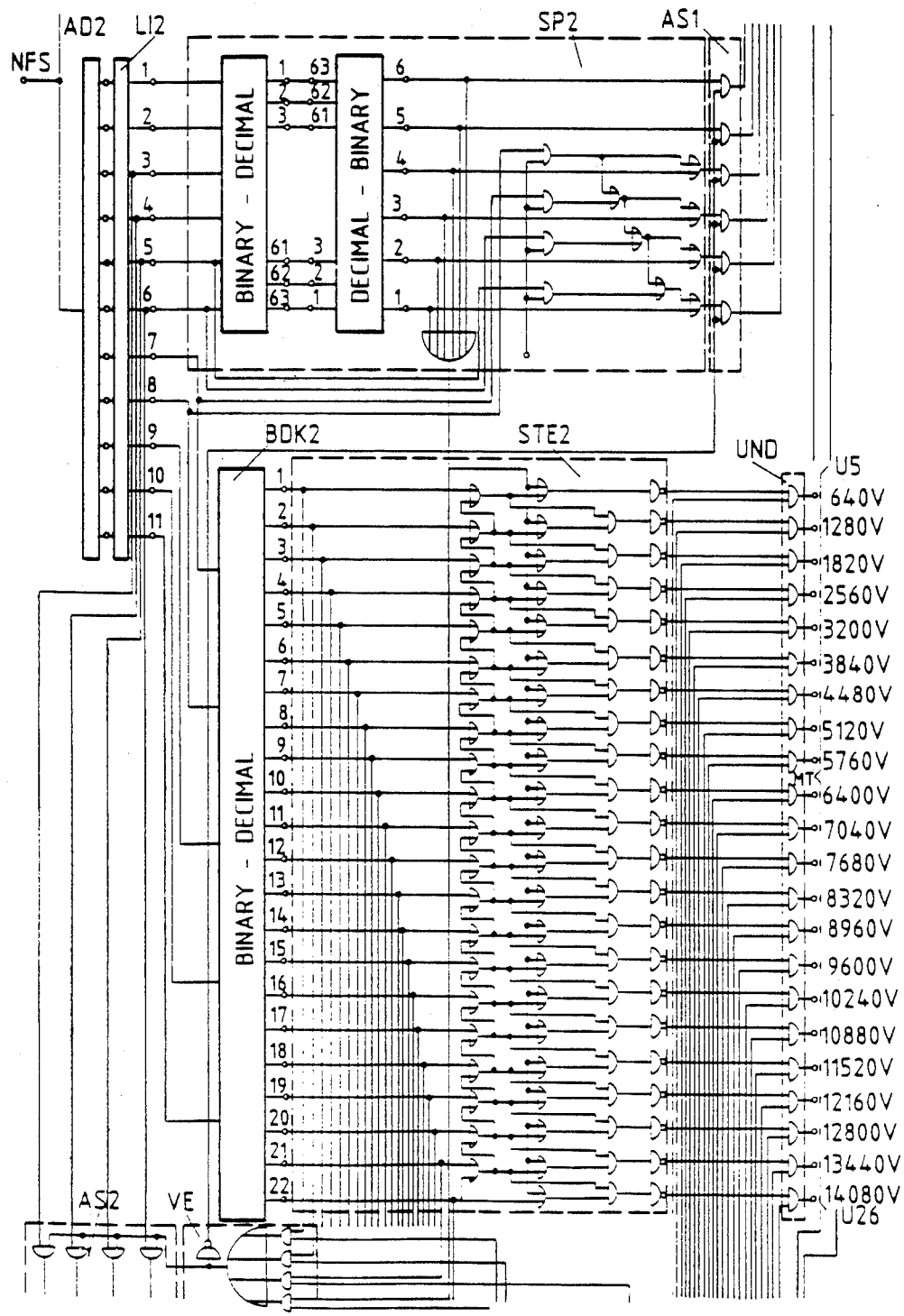
Figure 16:
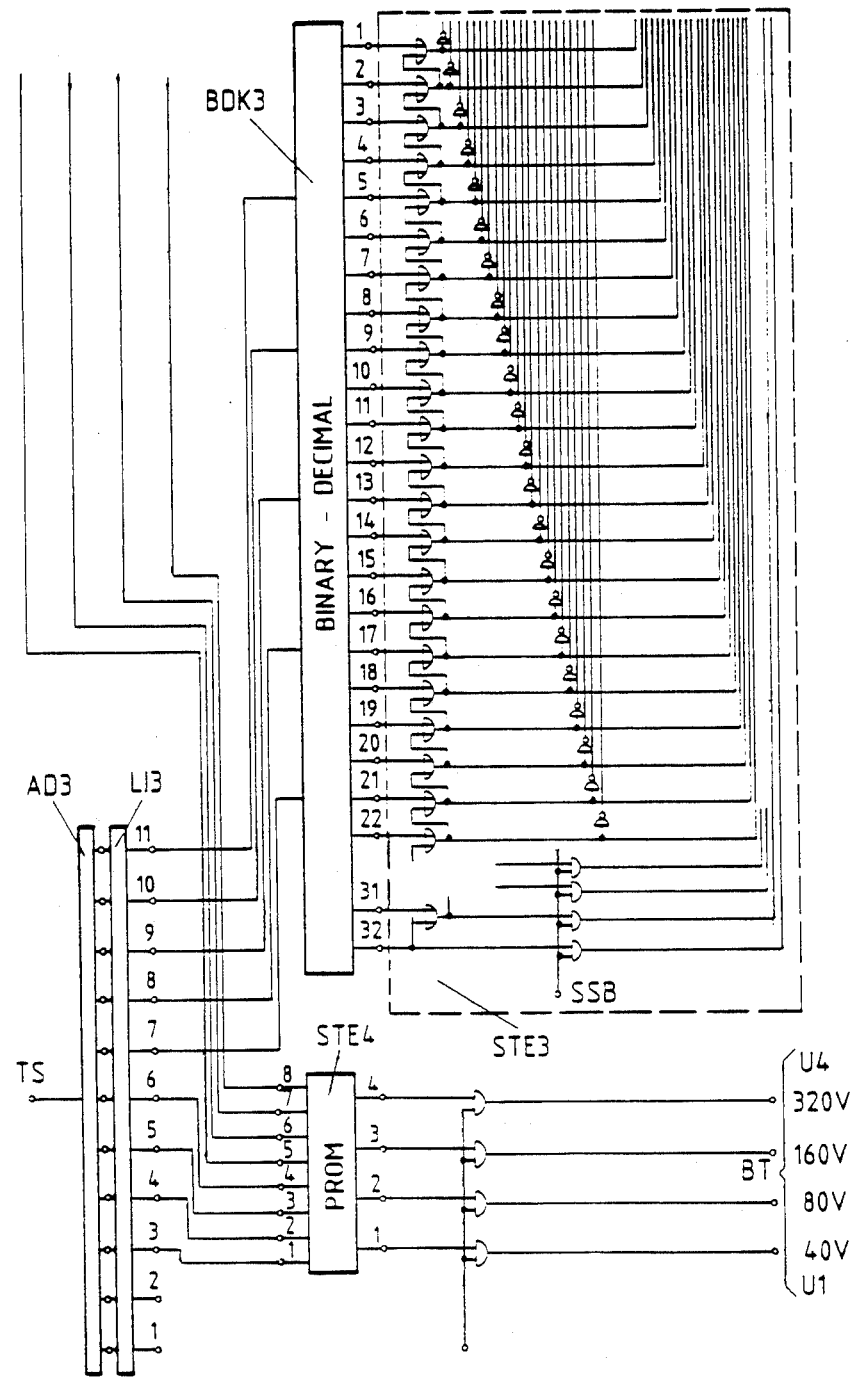

The invention is not limited to the embodiment described above but, rather, is applicable to similar devices. It is possible, for example, to replace completely the circuit arrangement shown in FIG. 8 by a suitably programmed computer. FIGS. 14 to 16 show a more detailed description of a switching amplifier according to FIG. 8. For a complete view it is necessary to connect the bottom of FIG. 14 with the top of FIG. 15 and the bottom of FIG. 15 with the top of FIG. 16. In the FIGS. 14 to 16 the circuit elements, e.g. STE1, SP1, of FIG. 8 are marked with dashed lines. These circuit elements include e.g. AND-gates, OR-gates and/or inverters. The A/D-converters are commercially available 11-bit-converters too. The binary-decimal-converters consist e.g. of a cascade circuit of commercially available 3-bit-binary-decimal-converters.

The present disclosure relates to the subject matter disclosed in German Pat. No. P 35 34 679.5 of Sept. 28th, 1985, the entire specification of which is incorporated herein by reference.

It will be understood that the above description of the present invention is susceptible to various modifications, changes and adaptations, and the same are intended to be comprehended within the meaning and range of equivalents of the appended claims.

What is claimed is:

1. A switching amplifier for amplifying an input signal to produce a high voltage output signal to be fed to a high frequency output stage of a transmitter having a distortion level below a selected value, said amplifier comprising:

a plurality of electronically switchable partial voltage sources each switchable between an on state for supplying an output voltage and an off state, said sources being connected together in series;

a plurality of rectifier diodes corresponding in number to said plurality of partial voltage sources and connected together in series aiding to form a series connection having output terminals for connection of a load;

means connecting each said diode across a respective partial voltage source; and control means connected to receive the input signal and to switch the partial voltage sources between their on and off states as a function of the input signal to generate the output signal between the output terminals, the improvement wherein:

said connecting means comprise at least one peak current limiter connected in series between one said partial voltage source and one said diode;

the number of said partial voltage sources and the magnitude of the voltage produced by each said partial voltage source are selected for maintaining the distortion level of the output signal below the selected value;

said control means comprise linearization means connected for compensating for non-linearities in the transmission characteristic of said amplifier; and said control means are operative for switching said partial voltage sources as a function of the polarity and amplitude of the input signal.

2. A switching amplifier as defined in claim 1 further comprising a low-pass filter connected to one of said terminals for connection in series with the load, and wherein the transmitter is a radio transmitter having an anode modulated high frequency output stage constituting the load, the transmitter is constructed to operate in different transmission modes, and said control means are operative to control said partial voltage sources in accordance with the desired transmission mode.

3. A switching amplifier as defined in claim 2 wherein:

the output signal is a carrier signal modulated with a low frequency signal;

said control means are connected to receive, as the input signal, the low frequency signal and a high frequency signal containing the carrier signal frequency, and a reference signal derived from the output terminals;

said control means comprise signal processing means for deriving a low frequency control signal representative of the low frequency signal and a carrier control signal representative of the carrier signal, the control signals being a function of the desired transmission mode, and switching means connected to receive the control signals and to derive therefrom signals for controlling said partial voltage sources;

said linearization means are connected to receive the reference signal, and to derive therefrom a correction signal, and to supply the correction signal to said control means;

said plurality of partial voltage sources are divided into a low frequency signal group and a carrier signal group; said switching means has a plurality of outputs each connected to a respective partial voltage source; and said switching means are operable for controlling said sources of said low frequency signal group as a function of the low frequency control signal and the correction signal, and for controlling said sources of said carrier signal group as a function of the carrier control signal, the low frequency control signal and the correction signal.

4. A switching amplifier as defined in claim 3 wherein:

one of the transmission modes in which the transmitter is constructed to operate is double sideband operation in which said control means control said voltage sources to produce an amplified version of the low frequency signal; and said control means are further operable to cause the output signal to have a full power or partial power level.

5. A switching amplifier as defined in claim 4 wherein the double sideband operation is with dynamic regulated amplitude modulation and said control means are operable for causing the carrier control signal to be a function of the dynamic of the low frequency signal.

6. A switching amplifier as defined in claim 3 wherein each of the control signals is a digital level signal subjected to a level correction by said linearization means and to a level measurement for causing the output signal to have a low distortion level.

7. A switching amplifier as defined in claim 3 wherein:

each said group of partial voltage sources is divided into a binary subgroup and a maximum voltage subgroup;

said voltage sources of said carrier signal group are controlled by the high frequency signal containing the carrier signal frequency;

the input signal is composed of alternating positive and negative half-waves and said control means act on said voltage sources of said low frequency signal group only in dependence on the positive half waves, and act on said voltage sources of said carrier signal group in dependence on the negative half waves;

each binary subgroup includes voltage sources for generating voltages which are substantially smaller than the voltages generated by the sources of the corresponding maximum voltage subgroup;

said control means operate in response to changes in each of the low frequency signal and high frequency signal to switch all sources of the associated binary and maximum voltage subgroup or only some sources of the associated binary subgroup and the sources of the associated maximum voltage subgroup.

8. A switching amplifier as defined in claim 6 wherein said control means comprise a comparator connected to derive the low frequency control signal from an envelope curve signal and a single sideband carrier signal for single sideband operation, and said switching means control said sources of said low frequency signal group in accordance with the low frequency control signal.

9. A switching amplifier as defined in claim 6 wherein:

said partial voltage sources of each said maximum voltage subgroup produce identical output voltages;

said partial voltage sources of each said binary subgroup produce output voltages which differ from one another by multiples of two; and said control means comprise level evaluaters which effect a signal level dependent gradation of the output signal by causing the switching on of higher voltage partial voltage sources of a binary subgroup associated with switching off of lower voltage sources, and binary-decimal converters for controlling the associated maximum voltage subgroups.

10. A switching amplifier as defined in claim 6 wherein said switching means respond to a change in the input signal to switch only those partial sources required to create the corresponding output signal charge.

11. A switching amplifier as defined in claim 7 wherein:

said partial voltage sources have a power supply including a transformer consisting of several secondary windings;

said secondary windings each are connected with the primary windings of a further transformer which has several secondary windings which are components of voltage sources that generate lower output voltages than a maximum voltage source;

said further transformer having an electrically conductive connection between its primary winding and one of its secondary windings for potential compensation.

12. A switching amplifier as defined in claim 3 wherein said linearization means comprise a programmable digital memory whose memory locations have addresses associated with respective digital control voltage input values and contain corrected control voltage output values, the digital control voltage input values correspond to respective reference signal values, and the corrected control voltage output values correspond to respective correction signal values.

13. A switching amplifier as defined in claim 2 wherein the output signal is a carrier signal modulated with a low frequency signal;

said control means are connected to receive, as the input signal, the low frequency signal and a high frequency signal containing the carrier signal frequency;

one of the transmission modes in which the transmitter is constructed to operate is single sideband operation in which said control means derive: a single sideband envelope curve signal from the low frequency and high frequency signals; carrier value from the high frequency signal; and a signal to be amplified by said sources from the high frequency signal, the envelope curve signal and the carrier value; and said control means are further operable to cause the output signal to have a full power or partial power level.

14. A switching amplifier as defined in claim 1 wherein said peak current limiter comprises a resistor.

15. A switching amplifier as defined in claim 14 wherein said peak current limiter further comprises a further diode connected in series with said resistor.

16. A switching amplifier as defined in claim 14 wherein said peak current limiter further comprises an inductor connected in parallel with said resistor.

17. A switching amplifier as defined in claim 16 wherein said peak current limiter further comprises a further diode connected in series with said resistor.

18. A switching amplifier as defined in claim 16 wherein said peak current limiter further comprises a further diode connected in series with said inductor.

19. A switching amplifier as defined in claim 1 wherein each of said electronically switchable partial voltage sources comprises a fixed voltage source and electronically controllable switching means connected in series with said fixed voltage source.

20. A switching amplifier as defined in claim 19 wherein said switching means of at least one said partial voltage source comprises at least two first semiconductor switches connected together in series.

21. A switching amplifier as defined in claim 20 wherein said switching means of said at least one partial voltage source further comprises at least two second semiconductor switches connected together in series and connected in parallel with said first semiconductor switches.

* * * * *

UNITED STATES PATENT AND TRADEMARK OFFICE
CERTIFICATE OF CORRECTION

PATENT NO. : 4,745,368                          Page 1 of 2

DATED : May 17, 1988

INVENTOR(S) : Manfred Lodahl

It is certified that error appears in the above-identified patent and that said Letters Patent is hereby corrected as shown below:

In the drawing, Figure 4 should be labeled Fig. 4A and Figure 4B should be added as shown on the attached sheet.

UNITED STATES PATENT AND TRADEMARK OFFICE
CERTIFICATE OF CORRECTION

PATENT NO. : 4,745,368

DATED : May 17, 1988

INVENTOR(S) : Manfred Lodahl

It is certified that error appears in the above-identified patent and that said Letters Patent is hereby corrected as shown below:

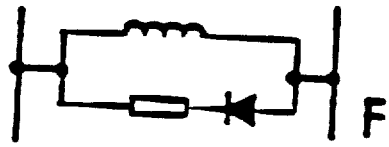

FIG. 4A

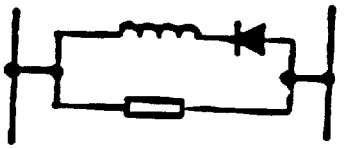

FIG. 4B

Signed and Sealed this

Eleventh Day of October, 1988

*Attest:*

DONALD J. QUIGG

*Attesting Officer*     *Commissioner of Patents and Trademarks*